(12) United States Patent
Tansu et al.

(10) Patent No.: US 8,569,737 B2
(45) Date of Patent: Oct. 29, 2013

(54) BROADBAND LIGHT EMITTING DIODES AND METHOD FOR PRODUCING SAME

(75) Inventors: Nelson Tansu, Bethlehem, PA (US); Xiaohang Li, Atlanta, GA (US); Hongping Zhao, Cleveland Heights, OH (US); Guangyu Liu, Bethlehem, PA (US); James Foster Gilchrist, Pasadena, CA (US); Pisist Kumnorkaew, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 82 days.

(21) Appl. No.: 13/314,685

(22) Filed: Dec. 8, 2011

(65) Prior Publication Data

US 2012/0217472 A1    Aug. 30, 2012

Related U.S. Application Data

(60) Provisional application No. 61/420,859, filed on Dec. 8, 2010.

(51) Int. Cl.
*H01L 31/00* (2006.01)
*H01L 29/06* (2006.01)

(52) U.S. Cl.
USPC .................................................. 257/13

(58) Field of Classification Search
CPC ......... H01L 33/04; H01L 33/38; H01L 33/06; H01L 33/16; H01L 33/20; B82Y 20/00; B82Y 40/00

USPC ............. 257/85, 90, E27.135, E27.138, 257/E29.069, E29.071, E29.245, 257/E49.001–E49.004, E21.404, 9–39
See application file for complete search history.

(56) References Cited

U.S. PATENT DOCUMENTS

| 8,035,113 | B2 * | 10/2011 | Moustakas et al. | 257/79 |
| 2005/0056850 | A1 * | 3/2005 | Taki | 257/79 |
| 2008/0191190 | A1 * | 8/2008 | Tsai et al. | 257/13 |
| 2010/0264441 | A1 * | 10/2010 | Kim | 257/98 |
| 2011/0155999 | A1 * | 6/2011 | Tansu et al. | 257/13 |
| 2012/0138947 | A1 * | 6/2012 | Li et al. | 257/76 |

* cited by examiner

*Primary Examiner* — Dao H Nguyen
*Assistant Examiner* — Tram H Nguyen
(74) *Attorney, Agent, or Firm* — Saul Ewing LLP (57) ABSTRACT

A III-Nitride semiconductor LED provides broadband light emission, across all or most of the visible light wavelength spectrum, and a method for producing same. The LED includes a polarization field management template that has a three-dimensional patterned surface. The surface may be patterned with an array of hemispherical cavities, which may be formed by growing the template around a temporary template layer of spherical or other crystals. The method involves growing a quantum well layer on the patterned surface. The topographical variations in the patterned surface of the template cause corresponding topographical variations in the quantum well layer. These variations in spatial orientation of portions of the quantum well layer cause the polarization field of the quantum well layer to vary across the surface of the LED, which leads to energy transition shifting that provides "white" light emission across a broad wavelength spectrum.

29 Claims, 6 Drawing Sheets

BROADBAND LIGHT EMITTING DIODES AND METHOD FOR PRODUCING SAME

CROSS-REFERENCE TO RELATED APPLICATIONS

This application claims the benefit of priority under 35 U.S.C. §119(e) of U.S. Provisional Patent Application No. 61/420,859, filed Dec. 8, 2010, the entire disclosure of which is hereby incorporated herein by reference.

STATEMENT OF GOVERNMENT INTEREST

This invention was made with government support under U.S. National Science Foundation—ECCS Award #0701421, and U.S. National Science Foundation—CBET Award #0828426. The government has certain rights in the invention.

FIELD OF THE INVENTION

The present invention relates generally to semiconductor light-emitting devices (LEDs) including gallium-nitride (GaN)-based quantum wells, and more particularly to a GaN-based semiconductor LED providing broadband (multi-spectra) emission producing "white" light suitable for home illumination, and a method for producing same.

DISCUSSION OF RELATED ART

A quantum well is a potential boundary that confines particles to a planar, substantially two dimension region. As used herein, the term "quantum well" refers to a thin-layer structure comprising alternate layers consisting of a first semiconductor layer with a thickness smaller than the de Broglie wavelength of about 200 Å to 300 Å with respect to electrons or holes and at least a second semiconductor layer with a bandgap greater than that of the first semiconductor layer. A "substrate" is an underlying template or substratum, such as a GaN substrate, a GaN/sapphire template, a Si substrate, a SiC substrate or a ZnO substrate.

The electrons and holes in the quantum well layer cannot move freely in the direction of thickness and are substantially confined two-dimensionally in a plane perpendicular to the thickness direction. The two-dimensional confinement increases bound energy of Coulombic electron, and hole attraction so that excitons occur under heat energy at room temperature.

Figure 1:
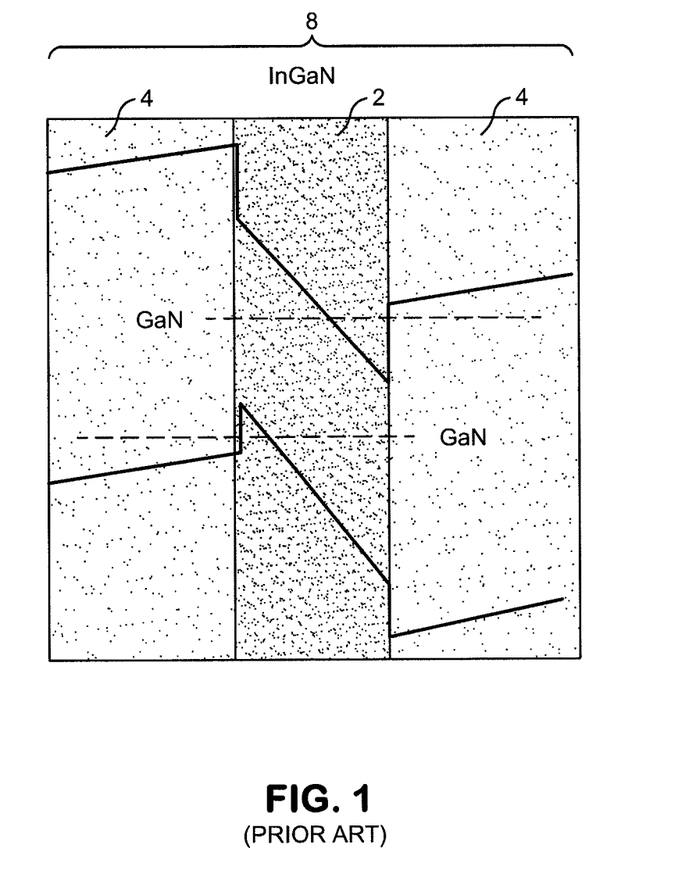
FIG. 1 is a diagrammatic representation of an exemplary prior art semiconductor LED's gallium-nitride-based quantum well that includes an InGaN layer sandwiched between higher bandgap layers of GaN.

A quantum well can be formed as part of a semiconductor by having a material, such as indium gallium nitride (InGaN), sandwiched between two layers of a larger bandgap material such as gallium nitride (GaN). FIG. 1 is a diagrammatic representation of an exemplary prior art gallium-nitride-based quantum well 8 that includes an active layer 2 of InGaN sandwiched between higher bandgap barrier layers 4 of GaN. For example, the InGaN active layer 2 may have a thickness of approximately 20 Å to 50 Å, and each barrier layer 4 may have a thickness of approximately 50 Å to 250 Å.

A quantum well effect can be achieved in a device by alternating two kinds of very thin semiconductor layers with different bandgap characteristics. As well known in the art, such structures can be grown by molecular beam epitaxy (MBE) and metalorganic chemical vapor deposition (MOCVD). These procedures can provide a layer having a thickness as small as a molecular monolayer.

Figure 2:
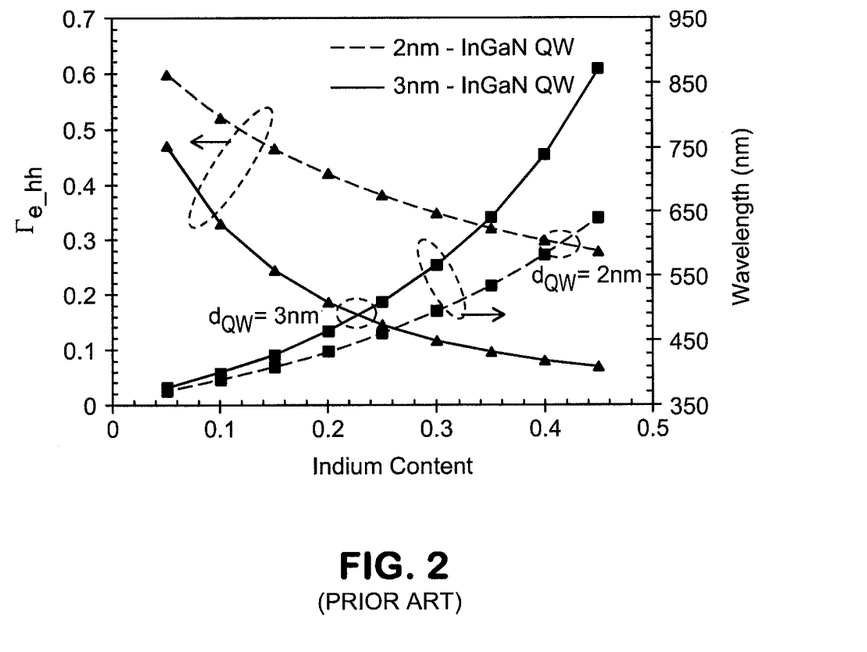
FIG. 2 is a graph showing electron-hole wave function overlap and peak emission wavelength vs. indium content for exemplary prior art InGaN quantum wells.

The GaN-based quantum well semiconductor suffers from large charge separation in the quantum well. Due to the polarization fields in an InGaN quantum well, the electron and hole wavefunctions are confined in opposite directions leading to reduction of the electron-hole wavefunction overlap ($\Gamma_{e\_hh}$), as shown in FIG. 2. The detrimental effect from such charge separation becomes more severe, as the emission wavelength of the InGaN quantum wells is extended into green, yellow and red spectral regimes. This means that "white" light, comprised of multi-spectra emission across a broad band of wavelengths, that is a suitable alternative to the "warm" light provided by incandescent lighting in home and general-purpose illumination, is difficult to obtain. In addition the ability to generate white light emission by using a light-emitting diode will result in significantly more energy-efficient light emitters.

Existing approaches for multiple-spectra broadband LED emission are not well-suited for solid state lighting applications. For example, one approach involves use of phosphor-based LEDs. However, such phosphor-based LEDs have relatively high packaging costs and an overall reduced efficiency due to Stokes shift, which means makes them generally poorly suited for widespread use in lighting applications. More specifically, the use of phosphor-based technology to down-convert blue-photons from blue-emitting LEDs is limited by the Stokes shift energy loss, which results in challenges in achieving high wall-plug efficiency LEDs that produce white light. By way of further example, an alternative approach involves use of carrier distribution of vertical multiple-stacked InGaN QWs. However, this approach leads to non-uniform carrier distribution, and therefore the light intensity and color spectra will be strongly influenced by current injection level. The use of vertically-stacked, dissimilar InGaN QWs will result in ratio of the light intensity of emission wavelengths from each QWs to be changing with current density, which in turn results in changing color temperature as the current density is varied. Yet another approach involves a "two-facet" quantum well, in which the use of the trapezoidal regrowth method enables the growth of GaN with facets of 0-degree and 60-degree orientations. The availability of the two facets enable the growth of InGaN QWs with two different polarizations/orientations, resulting in two-color LEDs. However, this approach is inherently limited to provide two-peak spectra, which is insufficient relative to the visible light spectrum to provide "white" light.

What is needed is a nitride-based white light LED capable of generating supercontinuum and broadband emission that covers the whole visible light region ($\lambda$~450-nm, 540 nm, 580 nm, and 630 nm), and provides warm white light suitable for home illumination.

SUMMARY

Generally, the present invention provides a III Nitride-based semiconductor LED including a polarization field management template having a three-dimensional patterned surface on which the quantum well layer is formed. Thus, the quantum well layer has topographical variations corresponding to those of the polarization field management template. These variations in spatial orientation of portions of the quantum well layer cause the polarization field of the quantum well layer to vary across the surface of the LED, which leads to energy transition shifting. The LED thus provides broadband emission (multi-spectra, across all or most of the visible light wavelength spectrum), and thus emits warm "white" light that is particularly well-suited for home-illumination applications.

In one embodiment, a III-Nitride based semiconductor device is provided that includes a polarization field management template of a first GaN-based material having a first conduction type. The polarization field management template comprises a patterned surface defining a plurality of concave cavities. The device further includes a quantum well layer formed on and substantially conforming to the patterned surface of the polarization field management template. The quantum well layer comprises a quantum well active layer sandwiched between first and second barrier layers. The quantum well active layer includes an inner layer of a first nitride-based material having a first bandgap characteristic; and a pair of outer layers of a second nitride-based material different from the first nitride-based material. The second nitride-based material has a second bandgap characteristic greater than the first bandgap characteristic. The pair of outer layers sandwiches the inner layer. The device further includes a conduction layer of a second GaN-based material having a second conduction type opposite to the first conduction type. The conduction layer covers at least substantially all of the quantum well layer.

A light emitting III-Nitride based semiconductor device comprising further includes a first contact of a first metal of the first conduction type in contact with the substrate, and a second contact of a second metal of the second conduction type in contact with the conduction layer.

In certain embodiments, the concave cavities are arranged in closely-packed relationship and/or in a substantially-uniform hexagonal array. In certain embodiments, the concave cavities are homogeneous and/or hemispherical in shape, e.g., having a maximum diameter measuring less than 1 micron.

Also provided is a method for manufacturing a III-Nitride based light-emitting semiconductor device. The method includes providing a substantially planar substrate of a first GaN-based material having a first conduction type; providing a template layer of crystals on the substantially planar substrate; growing a shaped layer of the first GaN-based material on the substrate and around the crystals; removing the crystals to reveal a polarization field management template comprising a patterned surface defining a plurality of concave cavities; growing a quantum well layer on and substantially conforming to the patterned surface of the polarization field management template; growing a conduction layer of a second GaN-based material having a second conduction type opposite to said first conduction type on the quantum well layer, the conduction layer covering at least substantially all of the quantum well layer; depositing a first metal of said first conduction type on said substrate to form a first contact; and depositing a second metal of said second conduction type on said conduction layer to form a second contact.

Provided also is a method for producing broadband light emission using a III-Nitride based light-emitting semiconductor device. The method involves providing the III-Nitride based light-emitting semiconductor device; and exciting the quantum well layer to produce optical emission from the shaped quantum well layer.

BRIEF SUMMARY OF DRAWINGS

The present invention will now be described by way of example with reference to the following drawings in which.

DETAILED DESCRIPTION

The present invention provides a III-Nitride (e.g., GaN-based) semiconductor LED that provides broadband (multi-spectra, e.g., in the red, yellow, green and blue spectra, across all or most of the visible light region, $\lambda$~450-nm, 540 nm, 580 nm, and 630 nm) white light emission. Further, the present invention provides a method for forming the III-Nitride semiconductor LED. More specifically, the LED includes a novel polarization field management template, which is formed by a novel process generally involving depositing a monolayer of crystals on a conductive substrate, growing conductive material on the substrate and around the crystals, and then removing the crystals to provide the polarization field management template. The polarization field management template thus has a three-dimensional patterned surface including an array of cavities, preferably hemispherical cavities. Forming a multiple quantum well (MQW) layer on the patterned surface causes the polarization fields of the MQWs to vary across the surface of the LED, and such variation leads to energy transition shifting, and thus "white" light emission across a broad wavelength spectrum.

Figure 3:
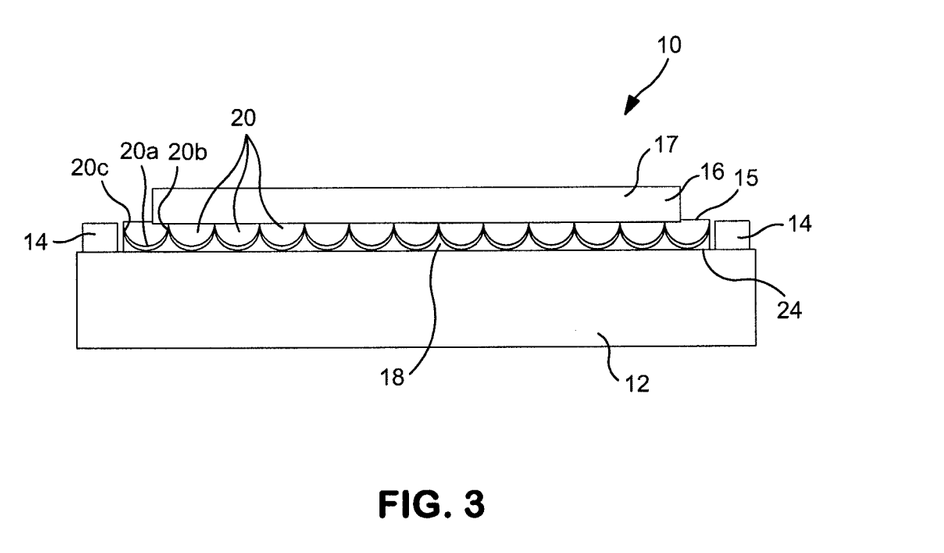
FIG. 3 is a diagrammatic representation of a GaN-based semiconductor LED having a polarization field management template and providing broadband supercontinuum spectrum white light in accordance with an exemplary embodiment of the present invention.

Referring now to FIG. 3, an exemplary III-Nitride semiconductor LED 10 including a polarization field management template is shown diagrammatically. As is typical of conventional III-Nitride semiconductor LEDs, the exemplary semiconductor LED 10 includes a c-plane substrate 12 that is substantially planar. In this example, the substrate 12 is formed of a GaN material, as is known in the art, and thus functions as an n-type layer, and includes at least one n-contact (electrode) 14 in electrical communication therewith. By way of example, the c-plane substrate 12 may be formed as a 2.5 μm layer of n-type doped GaN. For example, the substrate 12 may be formed by a conventional MOCVD process. Alternatively, the substrate may be formed in the range of about 3 to about 5 microns in thickness, and of other materials such as AlIN or AlGaInN.

As is typical of conventional III-Nitride semiconductor LEDs, the exemplary semiconductor LED 10 further includes a p-contact (electrode) 16, though it should be noted that the p-contact of the exemplary LED 10 is not purely conventional but rather is consistent with the present invention in that is specially formed and/or shaped (on at least one side) in correspondence with the polarization field management template as discussed in greater detail below; on an opposite side, the layer may be substantially planar, or non-planar. By way of example, the p-contact 16 may be formed as a conductive shaped layer 15 of p-type material, such as p-type doped GaN (pGaN) and a substantially planar layer 17 of p-metal formed thereon. For example, the conductive shaped layer 15 may be formed by a conventional MOCVD process, and the planar layer 17 can be deposited by electron-beam metal evaporation. The layers may be formed in the range of 200-300 nm thickness and alternatively, of other materials such as InGaN, AlInN, or AlGaInN.

In accordance with the present invention, the exemplary III-Nitride semiconductor LED 10 further includes a shaped layer 18 of n-type material, such as n-type doped GaN. The shaped layer 18 includes multiple cavities 20, each of which is hemispherical or partially-hemispherical, or substantially hemispherical (collectively "hemispherical") in shape. Thus, each cavity 20 has a valley portion 20a, located generally horizontally with reference to FIG. 3 or 4d, or in the 0-degree orientation, and a peak portion 20b, located generally vertically with reference to FIG. 3 or 4d, or in the 90-degree orientation. It will be appreciated that FIG. 3 shows the cavities in a two-dimensional representation for illustrative clarity, though in fact the cavities are three-dimensional in nature.

The combination of the shaped layer 18 and the substrate 12 form what is referred to herein as a polarization field management template 24, which has a three-dimensional patterned surface. Preferably, the surface includes cavities that are closely-packed and substantially homogeneous. Most preferably, the cavities are hemispherical.

Formed on the polarization field management template 24 is a semiconductor multiple quantum well (MQW) layer 30. The MQW layer may be formed in a generally conventional manner, using conventional techniques, materials and structures, except that the MQW is formed on the polarization field management template 24 in accordance with the present invention, and thus has a unique topography used to advantage in accordance with the present invention. In this example, the MQW layer 30 includes multiple quantum well stages, such as a MQW formed by 4-period growth. Each quantum well stage includes a quantum well confining the electrons and holes, and the quantum well is surrounded by adjacent barrier layers (such as a GaN layer) in a sandwich configuration. By way of example, each barrier layer may be formed of GaN, and each quantum well stage may be formed of one layer of InGaN (acting as an active layer) between two layers of GaN (acting as a barrier layer relative to the active layer). As will be appreciated by those skilled in the art, the barrier layer has a high bandgap characteristic relative to the electron and hole layers.

Accordingly, an exemplary four-period MQW 30 may include multiple layers as follows: GaN barrier/InGaN/GaN/InGaN/GaN/InGaN/GaN/InGaN/GaN barrier. Alternatively, the MQW 30 may be considered to include multiple layers as follows: GaN barrier/GAN/InGaN/GaN/InGaN/GaN/InGaN/GaN/InGaN/GaN/GaN barrier. In these examples, each GaN (or GaN barrier)/InGaN/GaN (or GaN barrier) combination is a "stage," and thus there are 4 stages, resulting from 4-period growth. For example, GaN barrier layers of 10 nm and four InGaN/GaN stages each having a well thickness of 3.5 nm is suitable for this purpose. By way of alternative example, AlGaInN may be used as an alternative to InGaN, layers in the range of 3-10 nm may be used, and about 2 to about 6 stages may be used. Any suitable quantum well layer 30 may be used.

Thus, it will be appreciated that the MQW layer 30 substantially conforms to the patterned surface of the polarization field management template 24. Thus, portions of the MQW layer 30 are oriented at 0-degrees (see 20a), portions are oriented at approximately +90 degrees (see 20b), and portions are oriented at approximately −90 degrees (see 20c), as shown with reference to FIGS. 3 and 4d. Further, portions of the MQW layer 30 are oriented along the continuous curve of the cavities 20 from approximately −90 degrees to approximately +90 degrees, as shown with reference to FIG. 3. Further, portions of the MQW layer 30 are oriented along the continuous curve (from −90 to +90 degrees) of the cavities in three-dimensions, e.g., not only in the plane of the cross-section shown in FIG. 3, but also out of the plane of the cross-section shown in FIG. 3. This variation in the physical orientation in space of the portions of the MQW layer 30 causes corresponding variation in respective polarization fields formed by those portions. Collectively, these portions provide an overall variation in the polarization field for the semiconductor LED as a whole that leads to an energy transition shift, which in turn leads to emission of light across a broad range of wavelengths, spanning the red, blue, yellow and green spectra. This broadband emission in multiple spectra combines to provides a "white" light emission perceived as a "warm" light that is a suitable alternative to incandescent light sources of a type often used for home, commercial, industrial and other general illumination purposes.

The exemplary semiconductor LED further includes a p-contact layer 16. The p-contact layer 16 may include a conductive shaped p-layer 15 covering the MQW layer and forming a substantially planar top surface for use as a mesa, and an additional substantially-planar layer 17. Optionally, these layers 15, 17 may be formed in a single process step or in multiple process steps, as discussed below in greater detail. In accordance with the present invention, the p-contact 16 is formed on, and thus is shaped to conform to, the MQW layer 30, which generally conforms to the patterned surface of the polarization field management template 24.

Figure 4A:
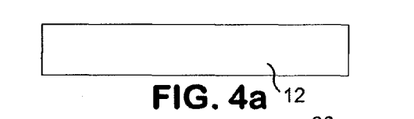
FIG. 4a is a diagrammatic representation of an exemplary n-GaN substrate.

An exemplary method for forming an exemplary GaN-based semiconductor LED including a polarization field management template and providing broadband light emission is described below with reference to FIGS. 4a-4g and FIG. 5. Referring now to FIGS. 4a and 5, the method begins with provision of a c-plane substrate 12 of material of a first conduction type, as shown at step 52. In this example, the first conduction type is n-type, but in alternative embodiments, the first conduction type could be p-type. As discussed above, the substrate 12 is conventional in nature and may be formed using any conventional technique. By way of example, a 2.5 µm layer of n-type doped GaN is suitable for this purpose. In accordance with the present invention, the method next involves depositing a very thin layer of crystals 30 on the substrate 12, as shown at step 54. Preferably, the crystals are homogeneous and are arranged in a closely-packed monolayer. The crystals 30 may be formed or provided in any suitable manner, and may be spherical or substantially spherical (collectively, "spherical"), or non-spherical. By way of example, a monolayer of substantially-uniform 1 micron-diameter $SiO_2$ microspheres may be deposited for this purpose. Alternatively, the spheres may have a diameter in the range of 0.5 to 1 micron. By way of further example, alternative structures may be used, such as $TiO_2$ instead of $SiO_2$ microspheres. Any suitable material may be used for this purpose provided that the material is amorphous, and thus prevents the growth of GaN having a single-crystal structure.

By way of further example, 1-micron $SiO_2$ microspheres may be deposited by a rapid convection deposition involving providing a colloidal suspension $SiO_2$ microspheres, providing a deposition blade above the substrate, depositing the colloidal suspension on the substrate, and sweeping the deposition blade over the substrate to distribute the $SiO_2$ over the substrate. The sweeping speed may be varied to ensure proper deposition of a monolayer. For example, for a deposition blade angle of 25 degree (and for 1-micron diameter $SiO_2$ sphere, the blade may be swept across the substrate at a speed of 45 µm/s. By way of alternative example, for a monolayer deposition of 0.5 µm $SiO_2$ microspheres and 1.0 µm $SiO_2$ microspheres, the optimal deposition speed using a hydrophilic blade at an inclination angle of 80 degrees may be 65 µm/s and 60 µm/s, respectively. Suitable $SiO_2$ microspheres can be prepared for example, by hydrolysis of tetraethoxysilane, or by a sol gel process, or by spray drying a colloidal silica gel. Suitable size spheres can be in the range from 0.05 microns up to 4 microns in diameter, preferably 0.1 micron to 2 microns. Suitable $SiO_2$ microspheres are commercially available from a variety of sources, such as Bangs Laboratories, Inc., 9025 Technology Drive, Fishers, Ind. 46038-2886 and are available in quantities with a standard size deviation of less than 1%. The $SiO_2$ microspheres can be deposited in a suspension media such as DI-water. The $SiO_2$ suspension may be optimized for 13% volume fraction in DI-water.

This technique is advantageous in that it exploits the tendency of monosized sub-micrometer spheres to spontaneously arrange into a closely-packed two-dimensional array. Further, strong capillary forces at the solid/air/water interface induce crystallization of microspheres into a two-dimensional array.

Figure 4B:
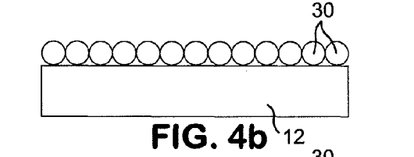
FIG. 4b is a diagrammatic representation of the n-GaN substrate of FIG. 4a, shown supporting a monolayer of spheres.
Figure 5:
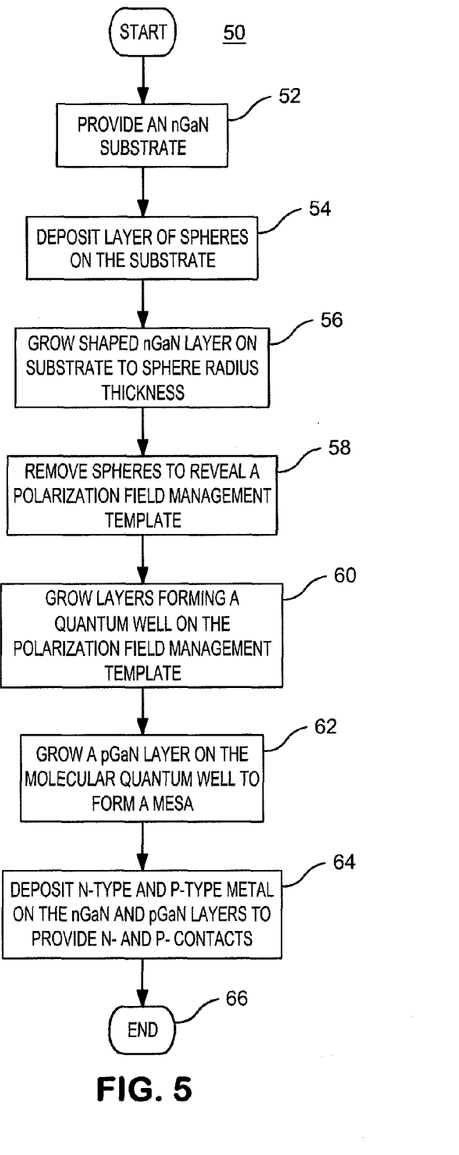
FIG. 5 is a flow diagram illustrating an exemplary method for forming a GaN-based semiconductor LED having a polarization field management template and providing broadband supercontinuum spectrum white light in accordance with an exemplary embodiment of the present invention.

FIG. 4b is a diagrammatic representation of an exemplary n-GaN substrate 12 shown supporting a monolayer of spheres 30. Exemplary spheres 30 can be seen in the scanning electron microscopy image of FIG. 6.

Figure 4C:
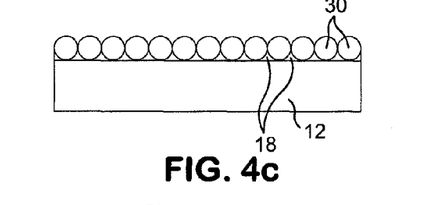
FIG. 4c is a diagrammatic representation of the n-GaN substrate of FIG. 4b shown after growth of a shaped n-GaN layer around the spheres.
Figure 6:
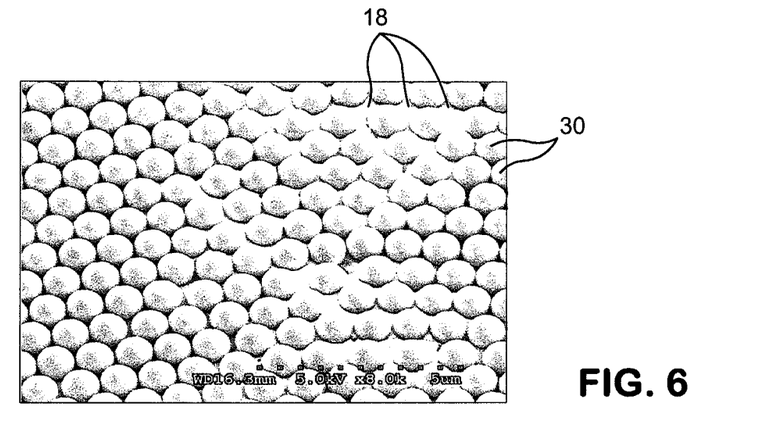
FIG. 6 is a scanning electron microscopy image showing the polarization field management template before removal of the spheres, corresponding to the structure of FIG. 4(b)

Next, the method involves growing a shaped layer 18 on the substrate 12, as shown at step 56 in FIG. 5, and as shown in FIG. 4c. More specifically, this step involves adding similar conduction-type material to the substrate 12 in the interstices between the crystals, e.g., between the lower hemispheres of the spheres. In this manner, the spheres 30 act as a three-dimensional template for forming the shaped layer 18. By way of example, the shaped layer 18 may be formed by growing n-type material on the n-type substrate to a thickness up to a radius of the spheres. For example, a shaped layer of nGaN having a maximum thickness of approximately 0.24 µm is suitable for this purpose. By way of example, such a layer may be grown using a metalorganic chemical vapor deposition (MOCVD) technique and triethylgallium, which is a low growth-rate source material, at a temperature of about 730 degrees C. Alternatively, other growth methods, such as molecular beam epitaxy (MBE), may be used to grow the shaped layer 18. FIG. 6 is a scanning electron microscopy image showing an exemplary resulting n-type shaped layer 18 and the spheres 30.

Figure 4D:
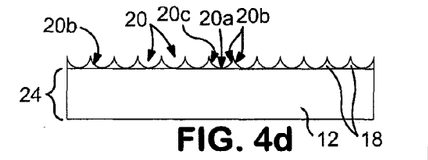
FIG. 4d is a diagrammatic representation of a polarization field management template formed by removing the spheres from the n-GaN substrate of FIG. 4c.
Figure 7:
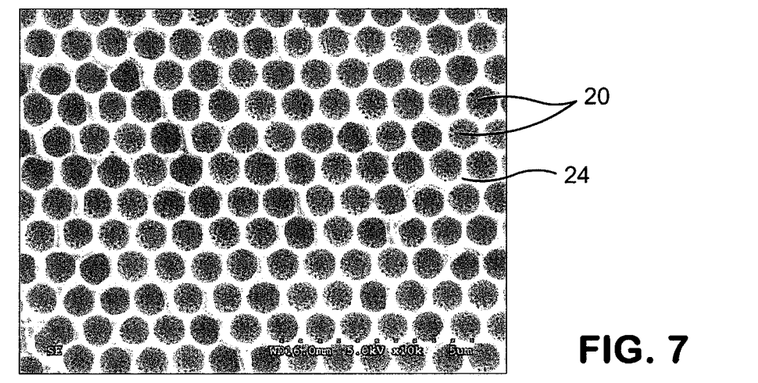
FIGS. 7 and 8 are scanning electron microscopy images showing the polarization field management template after removal of the spheres, corresponding to the structure of FIG. 4d, shown at 0-degree and 45-degree orientations, respectively.
Figure 8:
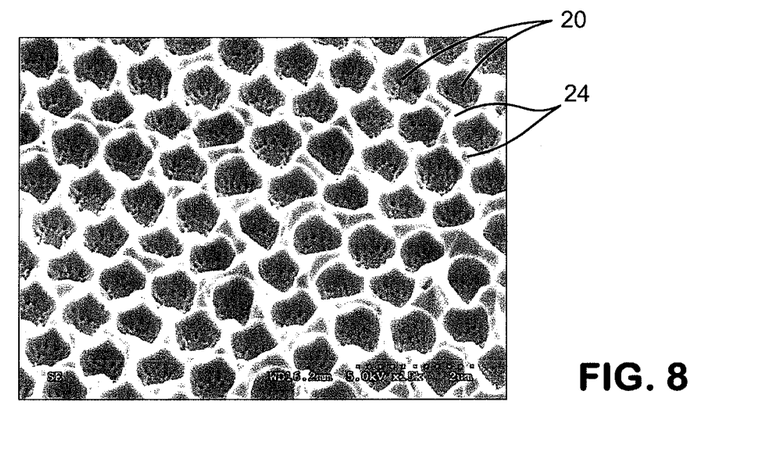

Next, as shown at step 58 of FIG. 5, the exemplary method involves removing the crystals 30 to reveal the shaped layer 18 and substrate 12, which collectively form the polarization field management template 24, as shown in FIG. 4d. The crystals may be removed in any suitable manner. In the example involving use of $SiO_2$ spheres, the spheres may be removed by etching with a hydrofluoric (HF) acid solution. FIGS. 7 and 8 are scanning electron microscopy images showing the polarization field management template 24 at 0-degree and 45-degree orientations, respectively, for illustrative clarity. The exemplary polarization field management template 24 has a three-dimensional patterned surface 24 defining a plurality of closely-packed hemispherical cavities 20, as shown in FIGS. 4d, 7 and 8.

Figure 4E:
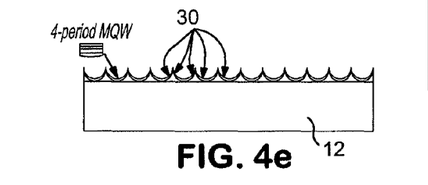
FIG. 4e is a diagrammatic representation of the polarization field management template of FIG. 4d supporting a multiple quantum well layer.

The method then involves growing an MQW layer 30 on the polarization field management template 24, as shown in step 60 of FIG. 5, which corresponds to FIG. 4e. In this example, the MQW layer 30 was formed by a MOCVD regrowth process. More specifically, in this example a four-period InGaN/GaN MQW layer 30 was formed by depositing layers of InGaN and GaN alloys using the MOCVD process. By way of example, an InGaN/GaN MQW layer having a 3.5 nm well thickness and a 10 nm barrier layer is suitable for this purpose. By way of alternative examples, an AlGaInN alloy may be used in forming the layers, 2 to 6 stages may be used, and alternatively the MBE process may be used to form the layers.

Figure 4F:
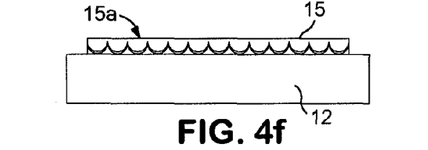
FIG. 4f is a diagrammatic representation of the structure of FIG. 4e after growth of a p-GaN conductive layer on the multiple quantum well layer.
Figure 4G:
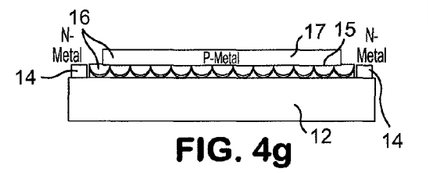
FIG. 4g is a diagrammatic representation of a GaN-based semiconductor LED having a polarization field management template and providing broadband supercontinuum spectrum white light in accordance with an exemplary embodiment of the present invention.

As shown at step 62 in FIG. 5, the method then involves growing a conduction layer 15 on the MQW layer 30. Preferably, this involves growing a conductive shaped layer 15 having one side conforming to and covering all or substantially all of the patterned surface of the MQW layer 30, and an opposite side that is substantially planar, and thus forms a mesa 15a, as shown in FIG. 4f. For example, this conductive shaped layer 15 may be formed using a p-GaN material, using the MOCVD process, and may have a thickness in the range of approximately 250 to 500 nm.

In this exemplary embodiment, the method further includes depositing n-type metal on the n-type substrate 12 to form an n-type contact 14, and depositing p-type metal on the conductive shaped layer 15 to form a p-type contact 17. For example, n-GaN and p-GaN may be used as layer 12 and layer 15, respectively.

In use, optical emission may be generated by exciting the active region of the semiconductor LED 10 by optically pumping or electrically injecting current into the device to produce optical emission from the MQW layer 30. The patterned three-dimensional MQW layer 30, provided in conformance with the patterned surface of the polarization field management template 24, causes portions of the MQW layer to be disposed in a variety of spatial orientations that cause variations in those portions' respective polarization fields. The collective effect on the polarization field results in significant red-shift in the emission wavelength. For example, the polarization field in a device including an InGaN QW with 15% Indium content enables a wavelength shift from approximately 410 nm to approximately 470 nm, due to the associated quantum confined Stark effect.

Accordingly, the continuous variation of the spatial orientation of the MQW layer 30 along the polarization field management template 20 results in continuous variation of the internal electric field within the MQW layer 30, which in turn results in tuning of the LED's overall emission wavelength from relatively long wavelengths (in the red range) down to relatively short wavelengths (in the blue range). The combined emission spans the blue, green, yellow and red spectral regimes, and thus provides an overall broadband "white" light emission. The change in the emission wavelength from the QW with different orientations is a result of the change in the electric field inside the QW at different orientations. This broadband emission in multiple spectrums combines to provide a "white" light emission perceived as a "warm" light that is a suitable alternative to incandescent light sources of a type often used for home, commercial, industrial and other general illumination purposes.

Figure 10:
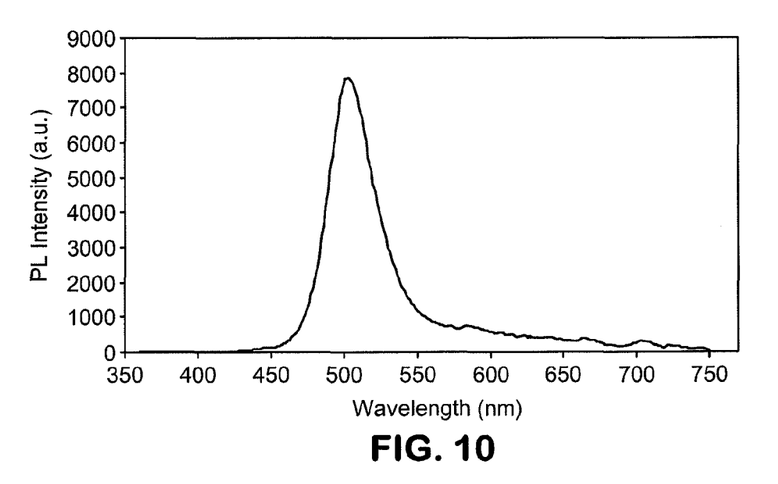
FIG. 10 is a graph of showing photoluminescence intensity as a function of wavelength for an exemplary GaN-based semiconductor LED including 4-period QW growth and without a polarization field management template in accordance with the present invention.

FIG. 10 is a graph of showing photoluminescence (PL) intensity as a function of wavelength for a generally-conventional GaN-based semiconductor LED that includes a 4-period QW. A He—Cd laser (~325 nm) was used as the excitation source from the top side of the samples, at room temperature, and PL intensity was collected from a top surface of the samples. As will be noted from FIG. 10, the PL intensity has a single peak around the 500 nm wavelength, wavelength, and the peak is relatively narrow spanning a wavelength range of approximately 50-80 nm.

Figure 9:
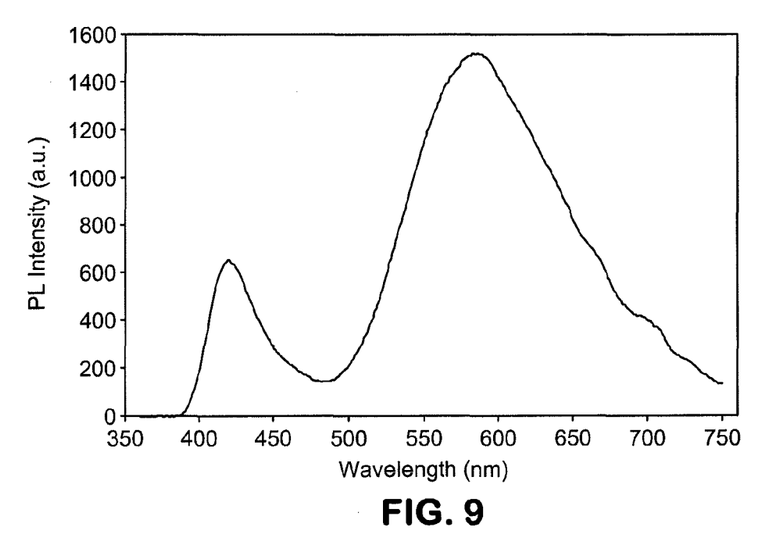
FIG. 9 is a graph of showing photoluminescence intensity as a function of wavelength for an exemplary GaN-based semiconductor LED including 4-period QW growth and with a polarization field management template in accordance with the present invention.

In sharp contrast, FIG. 9 is a graph of showing PL intensity as a function of wavelength for an exemplary GaN-based semiconductor LED including a polarization field management template 24 in accordance with the present invention. In particular, the GaN-based semiconductor LED in this example involved InGaN/GaN QWs grown on a polarization field management template grown using MOCVD to a thickness of about 0.24 microns around 1 micron $SiO_2$ spheres on a traditional 2.5 micron n-GaN c-plane substrate. This exemplary semiconductor LED includes a similar 4-period QW for comparative purposes. However, as will be noted from FIG. 9, the PL intensity has two peaks, around 425 nm and 600 nm, and spans a much broader wavelength band. Accordingly, it will be appreciated that the semiconductor LED including a polarization field management template in accordance with the present invention provides a broadband, multi-spectra emission as compared to a comparable conventional semiconductor LED, and thus provides a warmer "white" light.

A semiconductor LED 10 in accordance with the present invention may be embodied in various types of optoelectronic devices including light-emitting diodes, and may find application in solid state lighting, and display applications.

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed is:

1. A III-Nitride based semiconductor device comprising:
    a polarization field management template of a first GaN-based material having a first conduction type, said polarization field management template comprising a patterned surface defining a plurality of concave cavities;
    a quantum well layer formed on and substantially conforming to said patterned surface of said polarization field management template, said quantum well layer comprising a plurality of quantum well stages, each quantum well stage comprising:
        an inner layer of a first nitride-based material having a first bandgap characteristic; and
        a pair of outer layers of a second nitride-based material different from said first nitride-based material, said pair of outer layers sandwiching said inner layer, said second nitride-based material having a second bandgap characteristic greater than said first bandgap characteristic; and
    a conduction layer of a second GaN-based material having a second conduction type opposite to said first conduction type, said conduction layer covering at least substantially all of said quantum well layer.

2. The III-Nitride based semiconductor device of claim 1, wherein said plurality of concave cavities are arranged in closely-packed relationship.

3. The III-Nitride based semiconductor device of claim 1, wherein said plurality of concave cavities are arranged in a substantially-uniform hexagonal array.

4. The III-Nitride based semiconductor device of claim 1, wherein each of said plurality of concave cavities is hemispherical in shape.

5. The III-Nitride based semiconductor device of claim 4, wherein each of said plurality of concave has a maximum diameter measuring less than 1 micron.

6. The III-Nitride based semiconductor device of claim 1, wherein said substrate comprises nGaN material, and said conduction layer comprise pGaN material.

7. The III-Nitride based semiconductor device of claim 1, wherein said conduction layer has a first side contoured to conform to said quantum well layer, and a second side opposite said first side that is substantially planar.

8. The III-Nitride based semiconductor device of claim 1, wherein said polarization field management template is formed by growing GaN-based material on a substantially planar substrate and around a template layer provided on the substantially planar substrate.

9. The III-Nitride based semiconductor device of claim 8, wherein GaN-based material is grown using a metalorganic chemical vapor deposition process.

10. The III-Nitride based semiconductor device of claim 8, wherein said template layer comprises a layer of substantially-homogeneous crystals provided on the substantially planar substrate.

11. The III-Nitride based semiconductor device of claim 10, wherein said substantially-homogeneous crystals are substantially spherical in shape.

12. The III-Nitride based semiconductor device of claim 11, wherein said layer of substantially-homogeneous crystals comprises a monolayer of SiO2 spheres.

13. The III-Nitride based semiconductor device of claim 12, wherein said GaN-based material is grown on a substantially planar substrate to a maximum depth less than a radius of said spheres.

14. The III-Nitride based semiconductor device of claim 1, wherein said quantum well layer comprises a quantum well active layer of a InGaN sandwiched between first and second layers of GaN.

15. The III-Nitride based semiconductor device of claim 1, wherein each of said inner layers has a thickness in the range of 15 Å to about 60 Å, and wherein each of said outer layers has a thickness in the range of 50 Å to about 200 Å.

16. The III-Nitride based semiconductor device of claim 1, wherein said quantum well layer comprises a four-period InGaN/GaN quantum well.

17. A light emitting III-Nitride based semiconductor device comprising:
- a polarization field management template of a first GaN-based material having a first conduction type, said polarization field management template comprising a patterned surface defining a plurality of concave cavities;
- a quantum well layer formed on and substantially conforming to said patterned surface of said polarization field management template, said quantum well layer comprising a plurality of quantum well stages, each quantum well stage comprising:
  - an inner layer of a first nitride-based material having a first bandgap characteristic; and
  - a pair of outer layers of a second nitride-based material different from said first nitride-based material, said pair of outer layers sandwiching said inner layer, said second nitride-based material having a second bandgap characteristic greater than said first bandgap characteristic;
- a conduction layer of a second GaN-based material having a second conduction type opposite to said first conduction type, said conduction layer covering at least substantially all of said quantum well layer;
- a first contact of a first metal of said first conduction type in contact with said substrate; and
- a second contact of a second metal of said second conduction type in contact with said conduction layer.

18. The III-Nitride based semiconductor device of claim 1, wherein said first contact comprises n-type metal and said second contact comprises p-type metal.

19. A method for manufacturing a III-Nitride based light-emitting semiconductor device, the method comprising:
- providing a substantially planar substrate of a first GaN-based material having a first conduction type;
- providing a template layer of crystals on the substantially planar substrate;
- growing a shaped layer of the first GaN-based material on the substrate and around the crystals;
- removing the crystals to reveal a polarization field management template comprising a patterned surface defining a plurality of concave cavities;
- growing a quantum well layer on and substantially conforming to the patterned surface of the polarization field management template;
- growing a conduction layer of a second GaN-based material having a second conduction type opposite to said first conduction type on the quantum well layer, the conduction layer covering at least substantially all of the quantum well layer;
- depositing a first metal of said first conduction type on said substrate to form a first contact; and
- depositing a second metal of said second conduction type on said conduction layer to form a second contact.

20. The method of claim 19, wherein providing the template layer comprises depositing a layer of closely-packed spheres onto the substrate.

21. The method of claim 19, wherein providing the template layer comprises depositing a monolayer of $SiO_2$ spheres onto the substrate.

22. The method of claim 21, wherein depositing a monolayer of $SiO_2$ spheres onto the substrate comprises:
- providing a colloidal suspension of $SiO_2$ spheres;
- providing a deposition blade above the substrate;
- depositing the colloidal suspension on the substrate; and
- sweeping the deposition blade over the substrate to distribute the $SiO_2$ spheres over the substrate.

23. The method of claim 19, wherein growing a shaped layer of the first GaN-based material on the substrate and around the crystals comprises growing GaN-based material using metalorganic chemical vapor deposition.

24. The method of claim 23, wherein growing GaN-based material using metalorganic chemical vapor deposition comprises use of triethylgallium as a source material.

25. The method of claim 19, wherein removing the crystals to reveal a polarization field management template comprising a patterned surface defining a plurality of concave cavities comprises etching the template layer with acid.

26. The method of claim 19, wherein removing the crystals to reveal a polarization field management template comprising a patterned surface defining a plurality of concave cavities comprises etching the template layer with hydrofluoric acid.

27. The method of claim 19, wherein growing a quantum well layer on and substantially conforming to the patterned surface of the polarization field management template comprises growing quantum well layers in an MOCVD process.

28. The method of claim 19, wherein growing a conduction layer of a second GaN-based material having a second conduction type opposite to said first conduction type on the quantum well layer comprises growing the conduction layer in an MOCVD process.

29. A method for producing broadband light emission, the method comprising:
- providing a III-Nitride based light-emitting semiconductor device by:
  - providing a substantially planar substrate of a first GaN-based material having a first conduction type;
  - providing a template layer of crystals on the substantially planar substrate;
  - growing a shaped layer of the first GaN-based material on the substrate and around the crystals;
  - removing the crystals to reveal a polarization field management template comprising a patterned surface defining a plurality of concave cavities;
  - growing a quantum well layer on and substantially conforming to the patterned surface of the polarization field management template;
  - growing a conduction layer of a second GaN-based material having a second conduction type opposite to said first conduction type on the quantum well layer, the conduction layer covering at least substantially all of the quantum well layer; and
  - depositing a first metal of said first conduction type on said substrate to form a first contact; and
  - depositing a second metal of said second conduction type on said conduction layer to form a second contact; and
- exciting the quantum well layer to produce optical emission from the shaped quantum well layer.

* * * * *